United States Patent
Tekumalla et al.

(10) Patent No.: US 8,566,658 B2
(45) Date of Patent: Oct. 22, 2013

(54) LOW-POWER AND AREA-EFFICIENT SCAN CELL FOR INTEGRATED CIRCUIT TESTING

(75) Inventors: Ramesh C. Tekumalla, Breinigsville, PA (US); Priyesh Kumar, Pune (IN); Prakash Krishnamoorthy, Bethlehem, PA (US); Parag Madhani, Allentown, PA (US)

(73) Assignee: LSI Corporation, San Jose, CA (US)

( * ) Notice: Subject to any disclaimer, the term of this patent is extended or adjusted under 35 U.S.C. 154(b) by 134 days.

(21) Appl. No.: 13/216,336

(22) Filed: Aug. 24, 2011

(65) Prior Publication Data

US 2012/0246529 A1    Sep. 27, 2012

Related U.S. Application Data

(60) Provisional application No. 61/467,411, filed on Mar. 25, 2011.

(51) Int. Cl.
    *G01R 31/28* (2006.01)
(52) U.S. Cl.
    USPC .......................................... 714/729; 714/727
(58) Field of Classification Search
    USPC ........... 702/119; 327/218; 714/733, 726, 729, 714/727; 716/726
    See application file for complete search history.

(56) References Cited

U.S. PATENT DOCUMENTS

| | | | |
|---|---|---|---|
| 4,698,588 A | 10/1987 | Hwang et al. | |
| 5,887,004 A | 3/1999 | Walther | |
| 6,114,892 A | 9/2000 | Jin | |
| 6,412,098 B1 | 6/2002 | Jin | |
| 6,920,597 B2 * | 7/2005 | Rinderknecht et al. | 714/733 |

(Continued)

FOREIGN PATENT DOCUMENTS

| | | |
|---|---|---|
| EP | 12160993 | 7/2012 |
| JP | 4165644 A | 6/1992 |

(Continued)

OTHER PUBLICATIONS

Y. Tsiatouhas, "A Scan Flip-Flop for Low-Power Scan Operation," 14th IEEE International Conference, Electronics, Circuits and Systems (ICECS), Dec. 2007, pp. 439-432.

N. Parimi et al., "Toggle-Masking for Test-per-Scan VLSI Circuits," Proceedings of the 19th IEEE International Symposium on Defect and Fault Tolerance in VLSI Systems, Oct. 2004, pp. 332-338, Cannes, France.

(Continued)

*Primary Examiner* — David Ton
(74) *Attorney, Agent, or Firm* — Ryan, Mason & Lewis, LLP (57) ABSTRACT

An integrated circuit comprises scan test circuitry and additional circuitry subject to testing utilizing the scan test circuitry. The scan test circuitry comprises at least one scan chain having a plurality of scan cells, with the scan chain being configured to operate as a serial shift register in a scan shift mode of operation and to capture functional data from at least a portion of the additional circuitry in a functional mode of operation. At least a given one of the scan cells of the scan chain comprises output control circuitry which is configured to disable a functional data output of the scan cell in the scan shift mode of operation and to disable a scan output of the scan cell in the functional mode of operation.

22 Claims, 4 Drawing Sheets

(56) References Cited

U.S. PATENT DOCUMENTS

| | | | |
|---|---|---|---|
| 7,340,658 B2 * | 3/2008 | Seuring | 714/726 |
| 7,373,572 B2 * | 5/2008 | Mak et al. | 714/729 |
| 2004/0119502 A1 | 6/2004 | Chandar et al. | |
| 2006/0095802 A1 | 5/2006 | Dhong et al. | |
| 2008/0115025 A1 | 5/2008 | Frederick | |
| 2008/0195346 A1 * | 8/2008 | Lin et al. | 702/119 |
| 2008/0250283 A1 | 10/2008 | Block et al. | |
| 2009/0172819 A1 | 7/2009 | Pruden et al. | |
| 2009/0273383 A1 * | 11/2009 | Takatori et al. | 327/218 |

FOREIGN PATENT DOCUMENTS

| | | | |
|---|---|---|---|
| JP | 5172897 A | 7/1993 | |
| TW | 594030 B | 6/2004 | |
| WO | 0140943 A2 | 6/2001 | |
| WO | 0148493 A2 | 7/2001 | |

OTHER PUBLICATIONS

N. Parimi et al., "Toggle-Masking for Test-per-Scan VLSI Circuits," Proceedings of the 19th IEEE International Symposium on Defect and Fault Tolerance in VLSI Systems, Oct. 2004, pp. 332-338, Cannes, France.

N. Parimi et al., "Design of a Low-Power D Flip-Flop for Test-Per-Scan Circuits," Canadian Conference on Electrical and Computer Engineering, May 2004, pp. 777-780, vol. 2.

Z. Chen et al., "Low-Capture-Power At-Speed Testing using Partial Launch-on-Capture Test Scheme," IEEE Proceedings VLSI Test Symposium, Apr. 2010, pp. 141-146.

A. Mishra et al., "Modified Scan Flip-Flop for Low Power Testing," 19th IEEE Asian Test Symposium (ATS), Dec. 2010, pp. 367-370, Shanghai, China.

\* cited by examiner

LOW-POWER AND AREA-EFFICIENT SCAN CELL FOR INTEGRATED CIRCUIT TESTING

PRIORITY CLAIM

The present application claims priority to U.S. Provisional Patent Application Ser. No. 61/467,411, filed Mar. 25, 2011 and entitled "Low Power Flip-Flop Design," the disclosure of which is incorporated by reference herein.

FIELD OF THE INVENTION

The present invention relates generally to integrated circuit testing, and more particularly to integrated circuit testing using scan test circuitry.

BACKGROUND OF THE INVENTION

Integrated circuits are often designed to incorporate scan test circuitry that facilitates testing for various internal fault conditions. Such scan test circuitry typically comprises scan chains, which are chains of flip-flops that are used to form serial shift registers for applying test patterns at inputs to combinational logic of the integrated circuit and for reading out the corresponding results. A given one of the flip-flops of the scan chain may be viewed as an example of what is more generally referred to herein as a "scan cell."

In one exemplary arrangement, an integrated circuit with scan test circuitry may have a scan shift mode of operation and a functional mode of operation. A flag may be used to indicate whether the integrated circuit is in scan shift mode or functional mode. In the scan shift mode, the flip-flops of the scan chain are configured as a serial shift register. A test pattern is then shifted into the serial shift register formed by the flip-flops of the scan chain. Once the desired test pattern has been shifted in, the scan shift mode is disabled and the integrated circuit is placed in its functional mode. Internal combinational logic results occurring during this functional mode of operation are then captured by the chain of scan flip-flops. The integrated circuit is then once again placed in its scan shift mode of operation, in order to allow the captured combinational logic results to be shifted out of the serial shift register formed by the scan flip-flops, as a new test pattern is being scanned in. This process is repeated until all desired test patterns have been applied to the integrated circuit.

As integrated circuits have become increasingly complex, scan compression techniques have been developed which reduce the number of test patterns that need to be applied when testing a given integrated circuit, and therefore also reduce the required test time. Additional details regarding compressed scan testing are disclosed in U.S. Pat. No. 7,831,876, entitled "Testing a Circuit with Compressed Scan Subsets," which is commonly assigned herewith and incorporated by reference herein.

Nonetheless, a need remains for further improvements in scan test circuitry. For example, significant reductions in the power and area requirements associated with implementation of scan chains would be highly desirable.

SUMMARY OF THE INVENTION

Illustrative embodiments of the invention provide improved circuitry and techniques for scan testing of integrated circuits. For example, in one or more such embodiments, scan test circuitry of an integrated circuit is configured to include at least one scan chain that comprises low-power and area-efficient scan cells. The scan cells are advantageously configured to provide reduced power consumption for an integrated circuit in both scan shift and functional modes of operation, by eliminating unnecessary logic transitions that would otherwise occur in these modes in portions of the integrated circuit that are driven by corresponding scan and functional data outputs of the scan cells. This may be achieved in one or more of the illustrative embodiments without any substantial increase in the power consumption or area requirements of the scan cells themselves, so as to provide an overall reduction in the power consumption and area requirements of the integrated circuit.

In one aspect, an integrated circuit comprises scan test circuitry and additional circuitry subject to testing utilizing the scan test circuitry. The scan test circuitry comprises at least one scan chain having a plurality of scan cells, with the scan chain being configured to operate as a serial shift register in a scan shift mode of operation and to capture functional data from at least a portion of the additional circuitry in a functional mode of operation. At least a given one of the scan cells of the scan chain comprises output control circuitry which is configured to disable a functional data output of the scan cell in the scan shift mode of operation and to disable a scan output of the scan cell in the functional mode of operation.

In another aspect, a scan cell is configurable with a plurality of other scan cells into a scan chain having a scan shift mode of operation and a functional mode of operation. The scan cell comprises output control circuitry which is configured to disable a functional data output of the scan cell in the scan shift mode of operation and to disable a scan output of the scan cell in the functional mode of operation.

A given scan cell in one or more of the illustrative embodiments may comprise, in addition to its functional data output and its scan output, a functional data input, a scan input, a scan enable input, a multiplexer, and a flip-flop. The multiplexer has a first input coupled to the functional data input, a second input coupled to the scan input, and a select line coupled to the scan enable input, and the flip-flop has an input coupled to an output of the multiplexer. The output control circuitry is coupled between an output of the flip-flop and the functional data and scan outputs of the scan cell.

Such a scan cell configuration eliminates unnecessary logic transitions that would otherwise occur in those portions of an integrated circuit that are driven by a scan output of the scan cell in the functional mode of operation or by a functional data output of the scan cell in the scan shift mode of operation. As mentioned above, this advantage is achieved without significantly increasing the power or area requirements of the scan cell itself. For example, the scan cell does not require additional flip-flops or signal ports, nor does it exhibit significant additional timing dependencies.

DETAILED DESCRIPTION OF THE INVENTION

The invention will be illustrated herein in conjunction with exemplary testing systems and corresponding integrated circuits comprising scan test circuitry for supporting scan testing of other internal circuitry of those integrated circuits. It should be understood, however, that the invention is more generally applicable to any testing system or associated integrated circuit in which it is desirable to provide improved performance in terms of reduced power consumption and area requirements for scan testing.

Figures 1, 2:
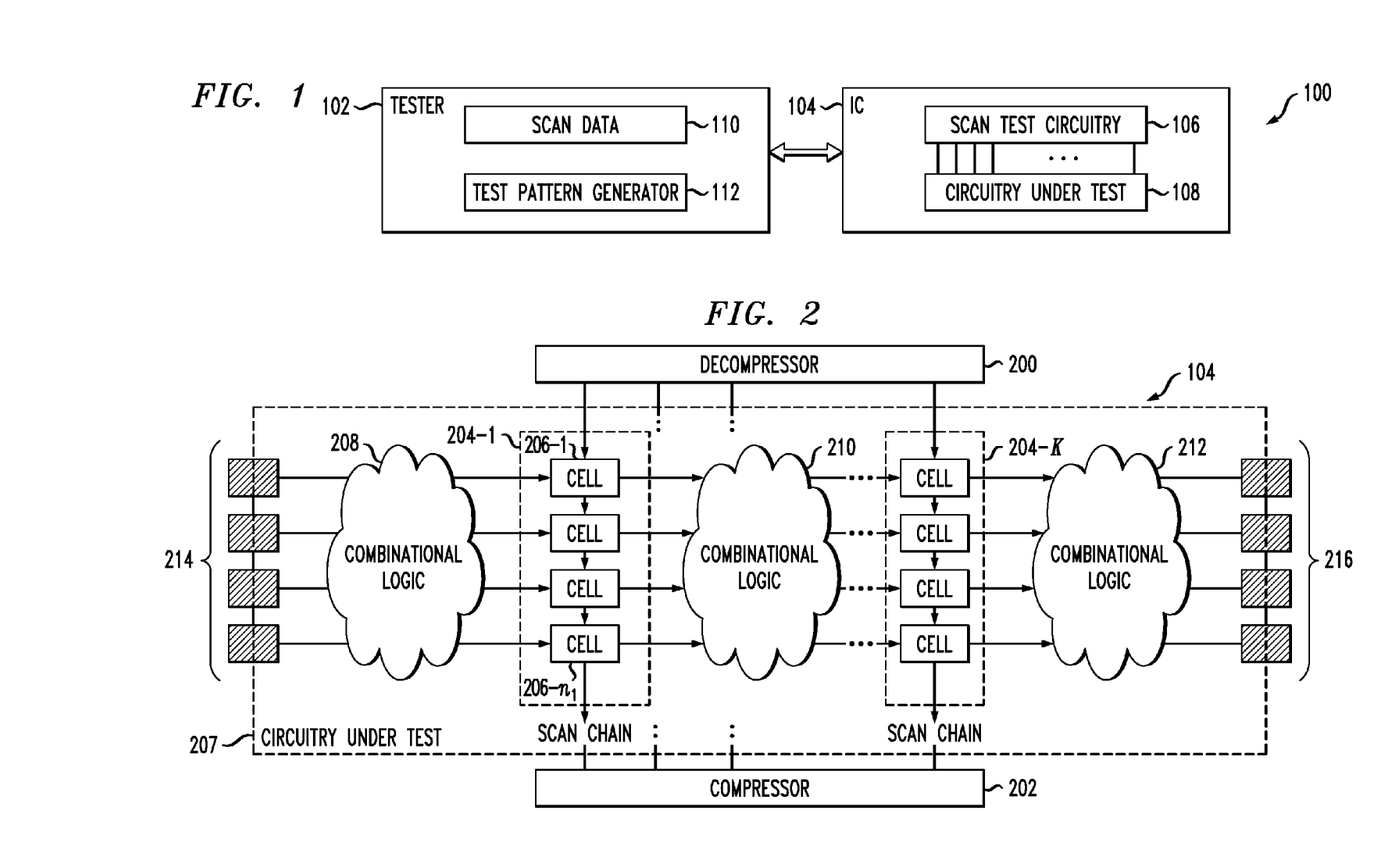
FIG. 1 is a block diagram showing an integrated circuit testing system comprising a tester and an integrated circuit under test in an illustrative embodiment.
FIG. 2 illustrates one example of the manner in which scan chains may be arranged between combinational logic in the integrated circuit of FIG. 1.

FIG. 1 shows a testing system 100 comprising a tester 102 and an integrated circuit under test 104. The integrated circuit 104 comprises scan test circuitry 106 that is coupled to additional internal circuitry 108 that is subject to testing utilizing the scan test circuitry 106. The tester 102 stores scan data 110 associated with scan testing of the integrated circuit. Such scan data may correspond to test patterns provided by a test pattern generator 112. In other embodiments, at least a portion of the tester 102, such as the test pattern generator 112, may be incorporated into the integrated circuit 104.

The particular configuration of testing system 100 as shown in FIG. 1 is exemplary only, and the testing system 100 in other embodiments may include other elements in addition to or in place of those specifically shown, including one or more elements of a type commonly found in a conventional implementation of such a system. For example, various elements of the system 100 may be implemented, by way of example and without limitation, utilizing a microprocessor, central processing unit (CPU), digital signal processor (DSP), application-specific integrated circuit (ASIC), field-programmable gate array (FPGA), or other type of data processing device, as well as portions or combinations of these and other devices.

Embodiments of the present invention may be configured to utilize compressed or noncompressed scan testing, and the invention is not limited in this regard. However, certain embodiments such as that shown in FIG. 2 will be described primarily in the context of compressed scan testing.

Referring now to FIG. 2, portions of one potential configuration of the integrated circuit 104 are shown in greater detail. In this compressed scan testing arrangement, the scan test circuitry 106 comprises a decompressor 200, a compressor 202, and a plurality of scan chains 204-$k$, where k=1, 2, ... K. Each of the scan chains 204 comprises a plurality of scan cells 206, and is configurable to operate as a serial shift register in a scan shift mode of operation of the integrated circuit 104 and to capture functional data from circuitry under test 207 in a functional mode of operation of the integrated circuit 104. The first scan chain 204-1 is of length $n_1$ and therefore comprises $n_1$ scan cells denoted 206-1 through 206-$n_1$. More generally, scan chain 204-$k$ is of length $n_k$ and therefore comprises a total of $n_k$ scan cells. Circuitry under test 207 in this embodiment comprises a plurality of combinational logic blocks, of which exemplary blocks 208, 210 and 212 are shown. The combinational logic blocks are illustratively arranged between primary inputs 214 and primary outputs 216 and separated from one another by the scan chains 204.

Combinational logic blocks such as 208, 210 and 212 may be viewed as examples of what are more generally referred to herein as "additional circuitry" that is subject to testing utilizing scan test circuitry in embodiments of the present invention. By way of example, such blocks may represent portions of different integrated circuit cores, such as respective read channel and additional cores of a system-on-chip (SOC) integrated circuit in a hard disk drive (HDD) controller application.

The decompressor 200 receives compressed scan data from the tester 102 and decompresses that scan data to generate scan test input data that is shifted into the scan chains 204 when such chains are configured as respective serial shift registers in a scan shift mode of operation. The compressor 202 receives scan test output data shifted out of the scan chains 204, also when such chains are configured as respective serial shift registers in the scan shift mode of operation, and compresses that scan test output data for delivery back to the tester 102. Additional details regarding the operation of scan compression elements such as decompressor 200 and compressor 202 may be found in the above-cited U.S. Pat. No. 7,831,876. Again, scan compression elements such as decompressor 200 and compressor 202 may be eliminated in other embodiments.

The scan cells 206 in the illustrative embodiment of FIG. 2 are advantageously configured as low-power and area-efficient scan cells that can controllably disable their functional data outputs in the scan shift mode of operation and controllably disable their scan outputs in the functional mode of operation. Such an arrangement provides reduced power consumption for the integrated circuit 104 in both scan shift and functional modes of operation, by eliminating unnecessary logic transitions that would otherwise occur in these modes in portions of the integrated circuit 104 that are driven by corresponding scan and functional data outputs of the scan cells. As will become apparent, this desirable functionality is achieved without significantly increasing the power or area requirements of the scan cell itself. For example, the scan cells 206 do not require additional flip-flops or signal ports to implement the controllable output disabling functionality, nor do they exhibit significant additional timing dependencies as a result of such functionality.

Figure 3:
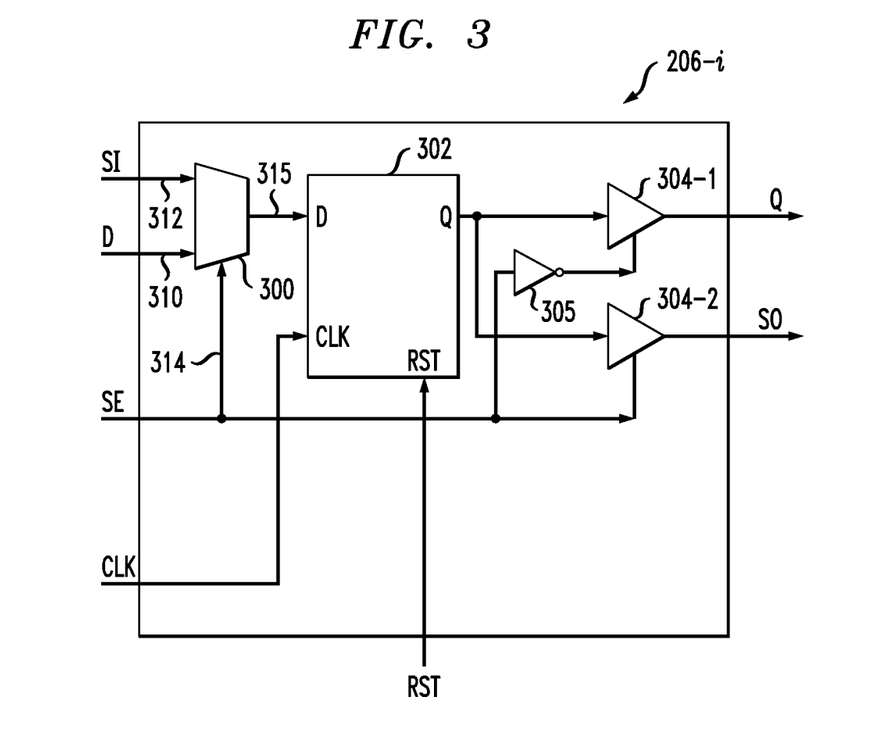
FIG. 3 is a schematic diagram showing one possible implementation of a given one of the scan cells of FIG. 2.

FIG. 3 shows a given one of the scan cells 206-$i$ in an illustrative embodiment. The scan cell in this embodiment comprises a multiplexer 300, a flip-flop 302, first and second tri-state buffers 304-1 and 304-2, and an inverter 305. The scan cell 206-$i$ has a functional data input (D), a scan input (SI), a scan enable input (SE), a functional data output (Q), a scan output (SO), a reset input (RST) and a clock input (CLK). The reset and clock inputs of the scan cell are coupled to corresponding inputs of the flip-flop 302. The flip-flop 302 also has a data input denoted D and a data output denoted Q, although these should be distinguished from the corresponding functional data input D and functional data output Q of the scan cell itself.

The multiplexer 300 has a first input 310 coupled to the functional data input D of the scan cell, a second input 312 coupled to the scan input SI of the scan cell, and a select line 314 coupled to the scan enable input SE of the scan cell. The flip-flop 302 is illustratively a resettable D-type flip-flop in the present embodiment, although other types of flip-flops can be used in other embodiments. The data input D of the flip-flop 302 is coupled to an output 315 of the multiplexer 300. The data output Q of the flip-flop 302 is coupled to inputs of the respective tri-state buffers 304-1 and 304-2.

The first and second tri-state buffers 304-1 and 304-1 and the inverter 305 may be collectively viewed as an example of what is more generally referred to herein as "output control circuitry" of the scan cell. Such output control circuitry is generally configured to disable the functional data output Q of the scan cell 206-i in the scan shift mode of operation and to disable the scan output SO of the scan cell 206-i in the functional mode of operation. The term "disable" in this context is intended to be broadly construed, and will generally cover arrangements in which logic level transitions which would otherwise occur in the corresponding output are instead prevented under certain conditions.

It will be assumed in this embodiment that a scan enable signal applied to the scan enable input SE of the scan cell is at a logic "1" level when the integrated circuit 104 is in a scan shift mode of operation and at a logic "0" level when the integrated circuit 104 is in the functional mode of operation. Other types and combinations of operating modes and scan enable signaling may be used in other embodiments.

The output control circuitry in this embodiment is coupled between the data output Q of the flip-flop 302 and the functional data and scan outputs Q and SO of the scan cell, and is operative responsive to the scan enable signal applied to the scan enable input SE of the scan cell. More particularly, the output control circuitry is operative to disable the functional data output Q of the scan cell and enable the scan output SO of the scan cell responsive to the scan enable signal being at a first binary logic level, in this embodiment a logic "1" level, and to disable the scan output SO of the scan cell and enable the functional data output Q of the scan cell responsive to the scan enable signal being at a second binary logic level, in this embodiment a logic "0" level.

In order to achieve this functionality, the scan enable signal is applied to a control input of the second tri-state buffer 304-2 and a complemented version of the scan enable signal, generated from the scan enable signal by the inverter 305, is applied to the control input of the first tri-state buffer 304-1. As a result, in the functional mode the scan output SO of the scan cell is tri-stated, thereby preventing functional transitions from propagating into portions of the integrated circuit that are driven by the scan output SO. Similarly, in the scan shift mode of operation, the functional data output Q of the scan cell is tri-stated, thereby preventing scan transitions from propagating into portions of the integrated circuit that are driven by the functional data output.

Although only a single scan cell 206-i is shown in FIG. 3, it may be assumed that the other scan cells 206 of the scan chains 204 in the scan test circuitry of FIG. 2 are each configured in substantially the same manner. Alternatively, different types of scan cells may be used in different ones of the scan chains, or within the same scan chain.

As indicated above, an advantage of the scan cell 206-i configured as shown in FIG. 3 is that it eliminates unnecessary logic transitions that would otherwise occur in both the scan shift and functional modes of operation in portions of the circuitry under test 207 that are driven by the corresponding scan and functional data outputs of the scan cells. Such transitions can occur in portions of the integrated circuit driven by the Q output of the scan cell in the scan shift mode of operation and in portions of the integrated circuit driven by the SO output of the scan cell in the functional mode of operation. Thus, this scan cell configuration reduces power consumption in the integrated circuit 104 in both the scan shift and functional modes of operation, without unduly increasing the circuit area required to implement the scan cells or the timing complexity of the scan test circuitry.

A scan cell of the type shown in FIG. 3 may be generated by modifying a standard scan cell from an integrated circuit design library to incorporate the output control circuitry in the form of a wrapper around the standard cell. This can be achieved without requiring the modification of any internal signaling or timing features of the standard cell, and without adding ports, extra flip-flops or other internal circuitry to the standard cell. The additional circuit area needed to accommodate the output control circuitry is minimal.

Figure 4:
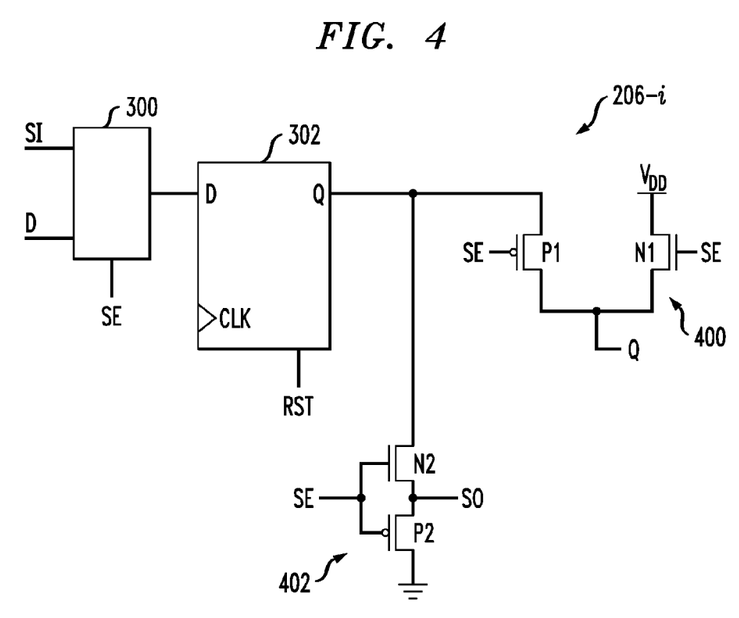
FIG. 4 is a schematic diagram showing another possible implementation of a given one of the scan cells of FIG. 2.

It should be noted that other types of scan cells and output control circuitry may be used in other embodiments. FIG. 4 shows an example of a scan cell 206-i configured in accordance with another illustrative embodiment of the invention. In this embodiment, the scan cell includes the multiplexer 300 and flip-flop 302, and has the same inputs and outputs as in the FIG. 3 embodiment. However, in this embodiment the output control circuitry comprises a first pair of MOS gates 400 and a second pair of MOS gates 402.

The first pair of MOS gates 400 more particularly comprises a first PMOS transistor P1 having its gate coupled to the scan enable input SE of the scan cell, its source coupled to the data output Q of the flip-flop 302, and its drain coupled to the functional data output Q of the scan cell, and a first NMOS transistor N1 having its gate coupled to the scan enable input SE of the scan cell, its drain coupled to an upper supply potential $V_{DD}$ and its source coupled to the functional data output Q of the scan cell.

The second pair of MOS gates 402 more particularly comprises a second PMOS transistor P2 having its gate coupled to the scan enable input SE of the scan cell, its source coupled to the scan output SO of the scan cell, and its drain coupled to a lower supply potential, illustratively ground potential in this embodiment, and a second NMOS transistor N2 having its gate coupled to the scan enable input SE of the scan cell, its source coupled to the scan output SO of the scan cell, and its drain coupled to the data output Q of the flip-flop.

In this embodiment, when a scan enable signal applied to the scan enable input SE of the scan cell 206-i is at a logic "1" level, the first and second PMOS transistors P1 and P2 are turned off and the first and second NMOS transistors N1 and N2 are turned on, such that the functional data output Q of the scan cell is disabled by being disconnected from the flip-flop output Q via the first PMOS transistor P1 and the scan output SO of the scan cell is enabled by being connected to the flip-flop output Q via the second NMOS transistor N2. When the scan enable signal applied to the scan enable input SE of the scan cell is at a logic "0" level, the first and second PMOS transistors P1 and P2 are turned on and the first and second NMOS transistors N1 and N2 are turned off, such that the functional data output Q of the scan cell is enabled by being connected to the flip-flop output Q via the first PMOS transistor P1 and the scan output SO of the scan cell is disabled by being disconnected from the flip-flop output Q via the second NMOS transistor N2.

It should also be noted that the particular arrangement of MOS gates used in the FIG. 4 embodiment is presented by way of example only, and other embodiments may use different circuitry arrangements to achieve the desired functionality. For example, analogous arrangements may be configured in which the NMOS gates are replaced with PMOS gates and vice-versa, with appropriate adjustment of signaling polarities.

Figure 5:
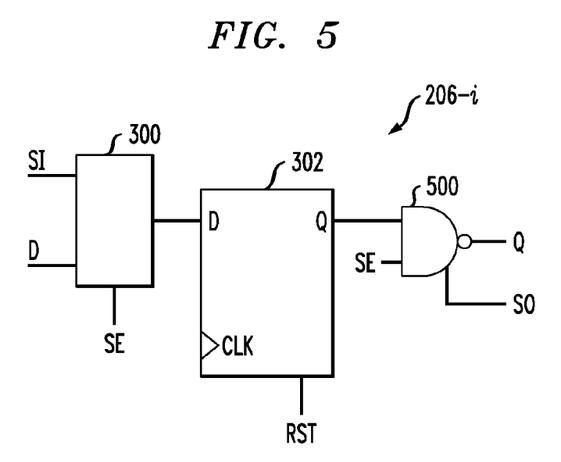
FIG. 5 shows a substantially equivalent circuit of the FIG. 4 scan cell using a NAND gate.

FIG. 5 shows a substantially equivalent implementation of the FIG. 4 embodiment. In this implementation, the output control circuitry comprises a logic gate 500 having a first input coupled to the Q output of the flip-flop 302, a second input coupled to the scan enable input SE of the scan cell, a first output coupled to the functional data output Q of the scan cell and a second output coupled to the scan output SO of the scan cell. The logic gate 500 is illustratively a NAND gate in the present embodiment, although other types and arrangements of logic gates can be used in other embodiments.

As mentioned above, low-power and area-efficient scan cells such as those illustrated in FIGS. 3 through 5 can significantly reduce the power consumption of an integrated circuit in both scan shift and functional modes of operation, without adversely impacting signaling and timing of the scan test circuitry. Existing scan flip-flops or other types of scan cells can be easily replaced with the low-power and area-efficient scan cells without any change in scan test functionality.

Figure 6:
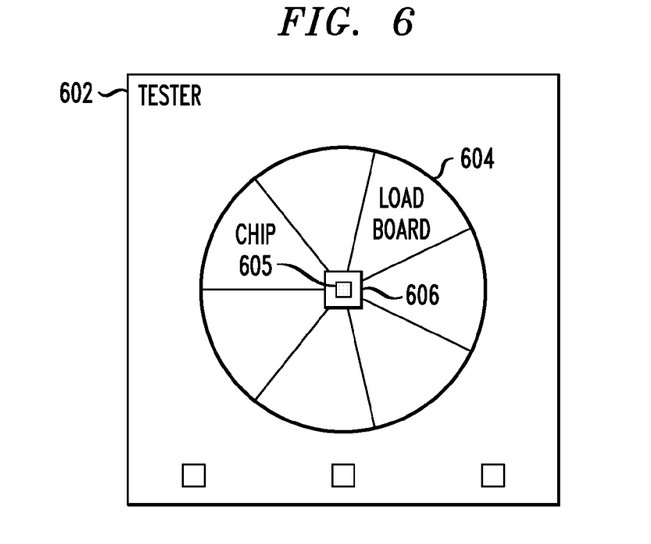
FIG. 6 shows one possible implementation of the testing system of FIG. 1.

The tester 102 in the testing system 100 of FIG. 1 need not take any particular form. One possible example is shown in FIG. 6, in which a tester 602 comprises a load board 604 in which an integrated circuit 605 to be subject to scan testing using the techniques disclosed herein is installed in a central portion 606 of the load board 604. The tester 602 may also comprise processor and memory elements for executing stored computer code, although such elements are not explicitly shown in the figure. Numerous alternative testers may be used to perform scan testing of an integrated circuit as disclosed herein.

Figure 7:
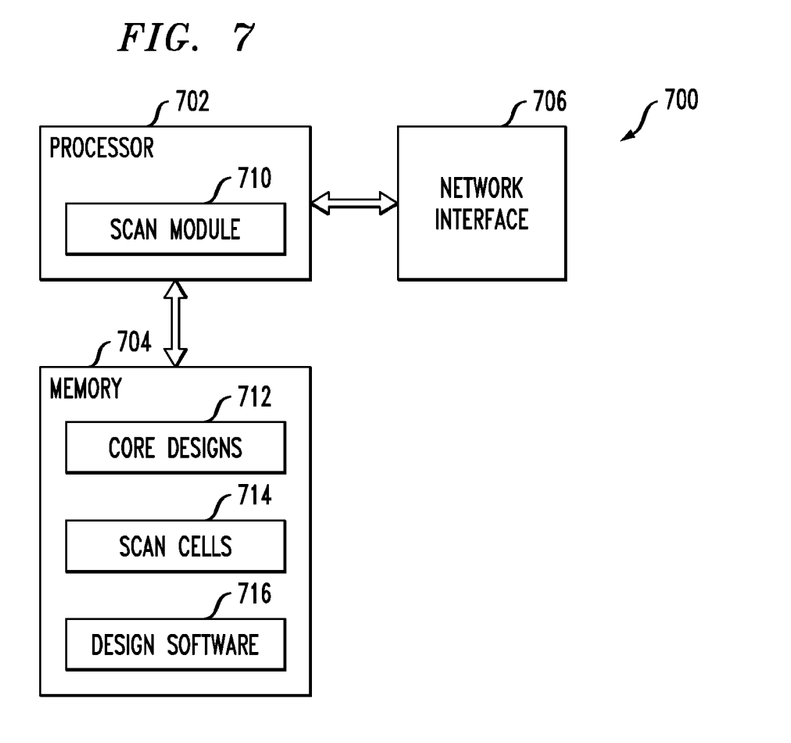
FIG. 7 is a block diagram of a processing system for generating an integrated circuit design comprising one or more scan chains each having one or more scan cells of the type shown in FIGS. 3-5.

The insertion of scan cells to form scan chains in scan test circuitry of an integrated circuit design may be performed in a processing system 700 of the type shown in FIG. 7. Such a processing system is configured for use in designing integrated circuits such as integrated circuit 104 to include scan test circuitry 106. The processing system 700 comprises a processor 702 coupled to a memory 704. Also coupled to the processor 702 is a network interface 706 for permitting the processing system to communicate with other systems and devices over one or more networks. The network interface 706 may therefore comprise one or more transceivers. The processor 702 implements a scan module 710 for supplementing core designs 712 with scan cells 714 in the manner disclosed herein, in conjunction with utilization of integrated circuit design software 716.

Elements such as 710, 712, 714 and 716 are implemented at least in part in the form of software stored in memory 704 and processed by processor 702. For example, the memory 704 may store program code that is executed by the processor 702 to implement particular scan cell insertion functionality of module 710 within an overall integrated circuit design process. The memory 704 is an example of what is more generally referred to herein as a computer-readable medium or other type of computer program product having computer program code embodied therein, and may comprise, for example, electronic memory such as RAM or ROM, magnetic memory, optical memory, or other types of storage devices in any combination. The processor 702 may comprise a microprocessor, CPU, ASIC, FPGA or other type of processing device, as well as portions or combinations of such devices.

As indicated above, embodiments of the present invention may be implemented in the form of integrated circuits. In a given such integrated circuit implementation, identical die are typically formed in a repeated pattern on a surface of a semiconductor wafer. Each die includes scan test circuitry as described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

Again, it should be emphasized that the embodiments of the invention as described herein are intended to be illustrative only. For example, the invention can be implemented using a wide variety of other types of scan test circuitry, with different types and arrangements of scan cells, gates and other circuit elements, than those previously described in conjunction with the illustrative embodiments. These and numerous other alternative embodiments within the scope of the following claims will be readily apparent to those skilled in the art.

What is claimed is:

1. An integrated circuit comprising:
   scan test circuitry; and
   additional circuitry subject to testing utilizing the scan test circuitry;
   the scan test circuitry comprising at least one scan chain having a plurality of scan cells, the scan chain being configured to operate as a serial shift register in a scan shift mode of operation and to capture functional data from at least a portion of the additional circuitry in a functional mode of operation;
   wherein at least a given one of the scan cells of the scan chain comprises output control circuitry which is configured to disable a functional data output of the scan cell in the scan shift mode of operation and to disable a scan output of the scan cell in the functional mode of operation;
   wherein the output control circuitry comprises:
      a first pair of devices comprising a first transistor and a second transistor;
      a second pair of devices comprising a third transistor and a fourth transistor;
   wherein the first pair of devices is configured to disable the functional data output of the given scan cell responsive to a scan enable signal being at a first binary logic level and to enable the functional data output of the given scan cell responsive to a scan enable signal being at a second binary logic level; and
   wherein the second pair of devices is configured to disable the scan output of the given scan cell responsive to the scan enable signal being at a second binary logic level and to enable the scan output of the given scan cell responsive to the scan enable single being at a first binary logic level.

2. The integrated circuit of claim 1 wherein the given scan cell further comprises:
   a functional data input;
   a scan input;
   a scan enable input;
   a multiplexer having a first input coupled to the functional data input, a second input coupled to the scan input, and a select line coupled to the scan enable input; and
   a flip-flop having an input coupled to an output of the multiplexer;
   the output control circuitry being coupled between an output of the flip-flop and the functional data and scan outputs of the scan cell.

3. The integrated circuit of claim 2 wherein the flip-flop comprises a resettable D-type flip-flop.

4. The integrated circuit of claim 2 wherein the output control circuitry is operative responsive to a scan enable signal applied to the scan enable input.

5. The integrated circuit of claim 1 wherein the output control circuitry is operative to disable the functional data output of the scan cell and enable the scan output of the scan cell responsive to a scan enable signal being at a first binary logic level and to disable the scan output of the scan cell and enable the functional data output of the scan cell responsive to the scan enable signal being at a second binary logic level.

6. The integrated circuit of claim 1, wherein the first and third transistors comprise one of p-type and n-type transistors and the second and fourth transistors comprise the other one of p-type and n-type transistors.

7. The integrated circuit of claim 1, wherein the output control circuitry does not comprise any transistors other than the first transistor, the second transistor, the third transistor and the fourth transistor.

8. An integrated circuit comprising:
scan test circuitry; and
additional circuitry subject to testing utilizing the scan test circuitry;
the scan test circuitry comprising at least one scan chain having a plurality of scan cells, the scan chain being configured to operate as a serial shift register in a scan shift mode of operation and to capture functional data from at least a portion of the additional circuitry in a functional mode of operation;
wherein at least a given one of the scan cells of the scan chain comprises output control circuitry which is configured to disable a functional data output of the scan cell in the scan shift mode of operation and to disable a scan output of the scan cell in the functional mode of operation;
wherein the given scan cell further comprises:
a functional data input;
a scan input;
a scan enable input;
a multiplexer having a first input coupled to the functional data input, a second input coupled to the scan input, and a select line coupled to the scan enable input; and
a flip-flop having an input coupled to an output of the multiplexer;
the output control circuitry being coupled between an output of the flip-flop and the functional data and scan outputs of the scan cell; and
wherein the output control circuitry comprises:
a first tri-state buffer coupled between the output of the flip-flop and the functional data output of the scan cell; and
a second tri-state buffer coupled between the output of the flip-flop and the scan output of the scan cell;
wherein a scan enable signal is applied to a control input of one of the first and second tri-state buffers and a complemented version of the scan enable signal is applied to the control input of the other one of the first and second tri-state buffers.

9. The integrated circuit of claim 8 further comprising an inverter having an input coupled to the scan enable input of the scan cell and operative to provide the complemented version of the scan enable signal.

10. An integrated circuit comprising:
scan test circuitry; and
additional circuitry subject to testing utilizing the scan test circuitry;
the scan test circuitry comprising at least one scan chain having a plurality of scan cells, the scan chain being configured to operate as a serial shift register in a scan shift mode of operation and to capture functional data from at least a portion of the additional circuitry in a functional mode of operation;
wherein at least a given one of the scan cells of the scan chain comprises output control circuitry which is configured to disable a functional data output of the scan cell in the scan shift mode of operation and to disable a scan output of the scan cell in the functional mode of operation;
wherein the given scan cell further comprises:
a functional data input;
a scan input;
a scan enable input;
a multiplexer having a first input coupled to the functional data input, a second input coupled to the scan input, and a select line coupled to the scan enable input; and
a flip-flop having an input coupled to an output of the multiplexer;
the output control circuitry being coupled between an output of the flip-flop and the functional data and scan outputs of the scan cell; and
wherein the output control circuitry comprises:
a first PMOS transistor having its gate coupled to the scan enable input, its source coupled to the output of the flip-flop, and its drain coupled to the functional data output of the scan cell;
a first NMOS transistor having its gate coupled to the scan enable input, its drain coupled to an upper supply potential and its source coupled to the functional data output of the scan cell;
a second PMOS transistor having its gate coupled to the scan enable input, its source coupled to the scan output of the scan cell, and its drain coupled to a lower supply potential; and
a second NMOS transistor having its gate coupled to the scan enable input, its source coupled to the scan output of the scan cell, and its drain coupled to the output of the flip-flop.

11. The integrated circuit of claim 10 wherein responsive to a scan enable signal applied to the scan enable input of the scan cell being at a logic high level, the first and second PMOS transistors are turned off and the first and second NMOS transistors are turned on, such that the functional data output of the scan cell is disabled by being disconnected from the flip-flop output via the first PMOS transistor and the scan output of the scan cell is enabled by being connected to the flip-flop output via the second NMOS transistor.

12. The integrated circuit of claim 10 wherein responsive to a scan enable signal applied to the scan enable input of the scan cell being at a logic low level, the first and second PMOS transistors are turned on and the first and second NMOS transistors are turned off, such that the functional data output of the scan cell is enabled by being connected to the flip-flop output via the first PMOS transistor and the scan output of the scan cell is disabled by being disconnected from the flip-flop output via the second NMOS transistor.

13. An integrated circuit comprising:
scan test circuitry; and
additional circuitry subject to testing utilizing the scan test circuitry;
the scan test circuitry comprising at least one scan chain having a plurality of scan cells, the scan chain being configured to operate as a serial shift register in a scan shift mode of operation and to capture functional data from at least a portion of the additional circuitry in a functional mode of operation;
wherein at least a given one of the scan cells of the scan chain comprises output control circuitry which is configured to disable a functional data output of the scan cell in the scan shift mode of operation and to disable a scan output of the scan cell in the functional mode of operation;
wherein the given scan cell further comprises:
a functional data input;
a scan input;
a scan enable input;

a multi psrbayinga first input coupled to the functional data input, a second input coupled to the scan input, and a select line coupled to the scan enable input; and a flip-flop having an input coupled to an output of the multiplexer;

the output control circuitry being coupled between an output of the flip-flop and the functional data and scan outputs of the scan cell; and wherein the output control circuitry comprises a logic gate having a first input coupled to the output of the flip-flop, a second input coupled to the scan enable input of the scan cell, a first output coupled to the functional data output of the scan cell and a second output coupled to the scan output of the scan cell.

14. The integrated circuit of claim 13 wherein the logic gate comprises a NAND gate.

15. A disk drive controller comprising the integrated circuit of claim 1.

16. A method of scan testing an integrated circuit, comprising:

providing scan test circuitry comprising at least one scan chain having a plurality of scan cells, the scan chain being configured to operate as a serial shift register in a scan shift mode of operation and to capture functional data from at least a portion of additional circuitry of the integrated circuit in a functional mode of operation;

disabling a functional data output of at least a given one of the scan cells in the scan shift mode of operation; and disabling a scan output of the given scan cell in the functional mode of operation;

wherein the disabling steps are performed by output control circuitry comprising:

a first pair of devices comprising a first transistor and a second transistor;

a second pair of devices comprising a third transistor and a fourth transistor;

wherein disabling the functional data output of the given scan cell comprises configuring the first pair of devices to disable the functional data output of the given scan cell responsive to a scan enable signal being at a first binary logic level; and wherein disabling the scan output of the given scan cell comprises configuring the second pair of devices to disable the scan output of the given scan cell responsive to the scan enable signal being at a second binary logic level.

17. The method of claim 16 wherein the disabling steps are performed responsive to a scan enable signal applied to a scan enable input of the given scan cell.

18. The method of claim 16 wherein the disabling steps further comprise:

disabling the functional data output of the scan cell and enabling the scan output of the scan cell responsive to a scan enable signal being at a first binary logic level; and disabling the scan output of the scan cell and enabling the functional data output of the scan cell responsive to the scan enable signal being at a second binary logic level.

19. A computer program product comprising a non-transitory computer-readable storage medium having computer program code embodied therein for use in scan testing an integrated circuit, wherein the computer program code when executed in a testing system causes the testing system to perform the steps of the method of claim 16.

20. A processing system comprising:

a processor; and a memory coupled to the processor and configured to store information characterizing an integrated circuit design;

wherein the processing system is configured to provide within the integrated circuit design scan test circuitry comprising at least one scan chain having a plurality of scan cells, the scan chain being configured to operate as a serial shift register in a scan shift mode of operation and to capture functional data from at least a portion of additional circuitry of the integrated circuit in a functional mode of operation;

wherein at least a given one of the scan cells of the scan chain comprises output control circuitry which is configured to disable a functional data output of the scan cell in the scan shift mode of operation and to disable a scan output of the scan cell in the functional mode of operation;

wherein the output control circuitry comprises:

a first pair of devices comprising a first transistor and a second transistor;

a second pair of devices comprising a third transistor and a fourth transistor;

wherein the first pair of devices is configured to disable the functional data output of the given scan cell responsive to a scan enable signal being at a first binary logic level and to enable the functional data output of the given scan cell responsive to a scan enable signal being at a second binary logic level; and wherein the second pair of devices is configured to disable the scan output of the given scan cell responsive to the scan enable signal being at a second binary logic level and to enable the scan output of the given scan cell responsive to the scan enable single being at a first binary logic level.

21. An apparatus for use in scan testing an integrated circuit, the apparatus comprising:

a scan cell configured to be arranged with a plurality of other scan cells into a scan chain having a scan shift mode of operation and a functional mode of operation;

wherein the scan cell comprises output control circuitry which is configured to disable a functional data output of the scan cell in the scan shift mode of operation and to disable a scan output of the scan cell in the functional mode of operation wherein the output control circuitry comprises:

a first pair of devices comprising a first transistor and a second transistor;

a second pair of devices comprising a third transistor and a fourth transistor;

wherein the first pair of devices is configured to disable the functional data output of the given scan cell responsive to a scan enable signal being at a first binary logic level and to enable the functional data output of the given scan cell responsive to a scan enable signal being at a second binary logic level; and wherein the second pair of devices is configured to disable the scan output of the given scan cell responsive to the scan enable signal being at a second binary logic level and to enable the scan output of the given scan cell responsive to the scan enable single being at a first binary logic level.

22. The apparatus of claim 21 wherein the scan cell further comprises:

a functional data input;

a scan input;

a scan enable input;

a multiplexer having a first input coupled to the functional data input, a second input coupled to the scan input, and a select line coupled to the scan enable input; and a flip-flop having an input coupled to an output of the multiplexer;

the output control circuitry being coupled between an output of the flip-flop and the functional data and scan outputs of the scan cell.

* * * * *

UNITED STATES PATENT AND TRADEMARK OFFICE
CERTIFICATE OF CORRECTION

PATENT NO. : 8,566,658 B2
APPLICATION NO. : 13/216336
DATED : October 22, 2013
INVENTOR(S) : Ramesh C. Tekumalla et al.

It is certified that error appears in the above-identified patent and that said Letters Patent is hereby corrected as shown below:

In the claim:

Claim 13, col. 11, line 1, please delete "multi psrbayinga" and insert --multiplexer having a--.

Signed and Sealed this
Thirty-first Day of December, 2013

Margaret A. Focarino
*Commissioner for Patents of the United States Patent and Trademark Office*